United States Patent
Hattangady et al.

(10) Patent No.: US 6,323,114 B1
(45) Date of Patent: Nov. 27, 2001

(54) STACKED/COMPOSITE GATE DIELECTRIC WHICH INCORPORATES NITROGEN AT AN INTERFACE

(75) Inventors: Sunil V. Hattangady, Dallas; Tad (Douglas) Grider, McKinney; John W. Kuehne, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/447,407

(22) Filed: Nov. 22, 1999

Related U.S. Application Data

(60) Provisional application No. 60/109,703, filed on Nov. 24, 1998.

(51) Int. Cl.$^7$ .................................................. H01L 21/3205
(52) U.S. Cl. ........................ 438/591; 438/592; 438/593; 438/594
(58) Field of Search .................................. 438/585, 591, 438/592, 593, 594

(56) References Cited

U.S. PATENT DOCUMENTS

| | | | |
|---|---|---|---|
| 5,422,291 | * | 6/1995 | Clementi et al. ................. 438/591 |
| 5,464,792 | * | 11/1995 | Tseng et al. ..................... 438/585 |
| 5,712,177 | * | 1/1998 | Kaushik et al. .................. 438/591 |
| 5,885,870 | * | 3/1999 | Maiti et al. ..................... 438/591 |
| 5,891,793 | * | 4/1999 | Gardner et al. ................... 438/585 |
| 5,960,302 | * | 9/1999 | Ma et al. ........................ 438/585 |
| 6,087,229 | * | 7/2000 | Aronowitz et al. ................ 438/591 |
| 6,162,687 | * | 12/2000 | Gardner et al. ................... 438/591 |
| 6,187,633 | * | 2/2001 | Dong et al. ...................... 438/591 |

* cited by examiner

Primary Examiner—John F. Niebling
Assistant Examiner—Lynne A. Gurley
(74) Attorney, Agent, or Firm—David Denker; Wade James Brady, III; Frederick J. Telecky, Jr.

(57) ABSTRACT

An embodiment of the instant invention is a method of fabricating an electronic device over a semiconductor substrate which includes a dielectric layer formed between a first structure and a second structure, the method comprising the steps of: growing an oxide-containing layer (layer 204 of FIGS. 2a–2d) on the first structure (substrate 202 of FIGS. 2a–2d); forming a silicon-containing layer (layer 206 of FIG. 2b) on the oxide-containing layer; oxidizing substantially all of the silicon-containing layer by subjecting it to an ambient comprised of oxygen and nitrogen with a substrate temperature around 700 to 800 C.; and forming the second structure (layer 214 of FIG. 2d) on the oxidized silicon-containing layer. Preferably, the step of oxidizing substantially all of the silicon-containing layer is performed by subjecting the silicon-containing layer to an ambient containing: $N_2O$ with a wafer temperature around 700 to 800 C.; or NO with a wafer temperature around 700 to 800 C. The nitrogen is, preferably, incorporated between the oxide-containing layer and the first structure and/or between the oxide-containing layer and the oxidized silicon-containing layer.

15 Claims, 1 Drawing Sheet

STACKED/COMPOSITE GATE DIELECTRIC WHICH INCORPORATES NITROGEN AT AN INTERFACE

This application claims priority under 35 USC §119(e)(1) of provisional application No. 60/109,703 filed Nov. 24, 1998.

FIELD OF THE INVENTION

The instant invention pertains to semiconductor device fabrication and processing and more specifically to a method of fabricating a stacked or composite gate dielectric layer which includes nitrogen at one or more interfaces.

BACKGROUND OF THE INVENTION

As integrated circuit complexity increases, the dimensions of the devices within the circuit necessarily decrease. Although one generally first thinks of reducing the source, gate and drain dimensions of field effect transistors, another device element whose dimension must also be shrunk is the thickness of the gate dielectric. Thicknesses less than several tens of nanometer are desirable for many of these device elements. However, as the gate dielectric becomes thinner, the importance of dielectric quality, including both low defect density and dielectric processing sensitivity, becomes greater with respect to device performance. Low defect density and processing sensitivity are, of course, also important in other integrated circuit applications.

In fact, in VLSI circuits, the quality of dielectric layers ultimately becomes a dominant factor in determining device performance. A field effect transistors (FETs) uses a voltage applied to a gate electrode, which is electrically insulated from the channel region by the thin gate dielectric layer situated beneath the gate electrode, to control current flow in a channel between source and drain regions. If the source and drain regions have n-type conductivity, a positive gate voltage, $V_g$, induces negative charges in the channel, and current flows in the channel when the gate voltage exceeds the threshold voltage. In an ideal FET, the gate voltage may be arbitrarily large with no current flow through, and charge storage, in the dielectric. In practice, however, it is impractical to eliminate trapped charges in the dielectric, which cause operating instabilities due to charge induced shifts in the threshold voltage. This shift may be better understood from the following considerations. The voltage shift due to the trapped charges is proportional to $Q_t/C$, where $Q_t$ is the trapped charge and C is the capacitance. Although the voltage shift decreases as the oxide thickness decreases, the compensation for trapped charges need not be reduced in the scaling to smaller dimensions. In fact, charge trapping, and defect induced dielectric breakdown set the scaling limits for thin oxides. It is thus essential that the number of defects in the dielectric be minimized for best device performance. However, at least one semiconductor device manufacturer has reported that the defect density, in particular, pinholes, increases with decreasing silicon oxide thickness once the oxide was less than 20 nm thick. Presently, silicon oxide, $SiO_2$, is the most commonly used dielectric material, at least for Si integrated circuits, and may be formed either by thermal growth or material deposition. Thermal oxidation of silicon involves a reaction of the oxide/silicon interface that is driven by inward movement of the oxidizing species. Thus, the silicon surface is continually renewed and the bulk $SiO_2$ is maintained with sufficient oxygen to remove the majority of the bulk and surface defects. Surface passivation reduces the number of states within the bandgap by lowering the number of dangling bonds because a stable $SiO_2$ film is formed.

Although deposited films can be formed more quickly than thermal oxides, the dielectric qualities of deposited films are generally inferior to those of thermally grown oxide films. Thus, deposited oxides have not been used as dielectrics because they typically have a higher defect density, lower breakdown fields, and high interface state densities. However, a low temperature plasma enhanced chemical vapor deposition process was reported as yielding a moderately high quality $SiO_2$ layer. See JOURNAL OF APPLIED PHYSICS 3136–3145 (Nov. 1, 1986). The interface trap density was reduced by a fast deposition anneal. Other deposition processes generally have an annealing step to both densify the oxide and improve its electrical integrity, but the results have not been as good as is desired if the oxide will be used as a gate dielectric. Another method of forming a gate dielectric involves growing an oxide film on the silicon substrate, depositing a thin oxide film on the grown oxide and then performing an anneal step in an oxygen ambient to form a thermally grown oxide layer between the grown oxide layer and the silicon substrate. See U.S. Pat. No. 5,153,701. A problem with this method is that deposited oxides are, typically, more prone to electron trapping than grown oxide films.

SUMMARY OF THE INVENTION

Basically, an embodiment of the instant invention is a method of forming a gate dielectric layer which is comprised of a grown oxide and a deposited silicon-containing layer (situated on the grown oxide) which is subsequently oxidized in an ambient containing oxygen and nitrogen. Preferably, nitrogen is incorporated at one or more of the following interfaces: between the grown oxide and the silicon substrate (for reliability improvements); and between the gate electrode and the gate dielectric (to inhibit diffusion of boron to the channel region). The stack configuration of this embodiment should have a lower defect density than a conventionally grown oxide layer.

An embodiment of the instant invention is a method of fabricating an electronic device over a semiconductor substrate which includes a dielectric layer formed between a first structure and a second structure, the method comprising the steps of: growing an oxide-containing layer on the first structure; forming a silicon-containing layer on the oxide-containing layer; oxidizing substantially all of the silicon-containing layer by subjecting it to an ambient comprised of oxygen and nitrogen with a substrate temperature around 700 to 800 C.; and forming the second structure on the oxidized silicon-containing layer. Preferably, the step of oxidizing substantially all of the silicon-containing layer is performed by subjecting the silicon-containing layer to an ambient containing: $N_2O$ with a wafer temperature around 700 to 800 C.; or NO with a wafer temperature around 700 to 800 C. The nitrogen is, preferably, incorporated between the oxide-containing layer and the first structure and/or between the oxide-containing layer and the oxidized silicon-containing layer.

In one embodiment of the instant invention, the electronic device is a transistor, and the first structure is a silicon substrate and the second structure is a gate electrode. Preferably, the gate electrode is comprised of a material selected from the group consisting of: doped polycrystalline silicon, tungsten, titanium nitride, ruthenium, rhodium, iridium, and any combination thereof.

In another embodiment of the instant invention, the electronic device is a capacitor, and the first structure is a bottom electrode of the capacitor and the second structure is the top electrode of the capacitor.

Another embodiment of the instant invention is a method of forming a gate dielectric layer formed between a semiconductor substrate and a conductive gate electrode, the method comprised of the steps of: growing an oxide-containing layer on the semiconductor substrate; forming a silicon-containing layer on the oxide-containing layer; oxidizing substantially all of the silicon-containing layer by subjecting it to an ambient comprised of oxygen and nitrogen with a substrate temperature around 700 to 800 C.; and forming the conductive gate electrode on the oxidized silicon-containing layer. Preferably, the step of oxidizing substantially all of the silicon-containing layer is performed by subjecting the silicon-containing layer to an ambient containing: $N_2O$ with a wafer temperature around 700 to 800 C.; or NO with a wafer temperature around 700 to 800 C. The nitrogen is incorporated between the oxide-containing layer and the first structure and/or between the oxide-containing layer and the oxidized silicon-containing layer.

Figure 1:
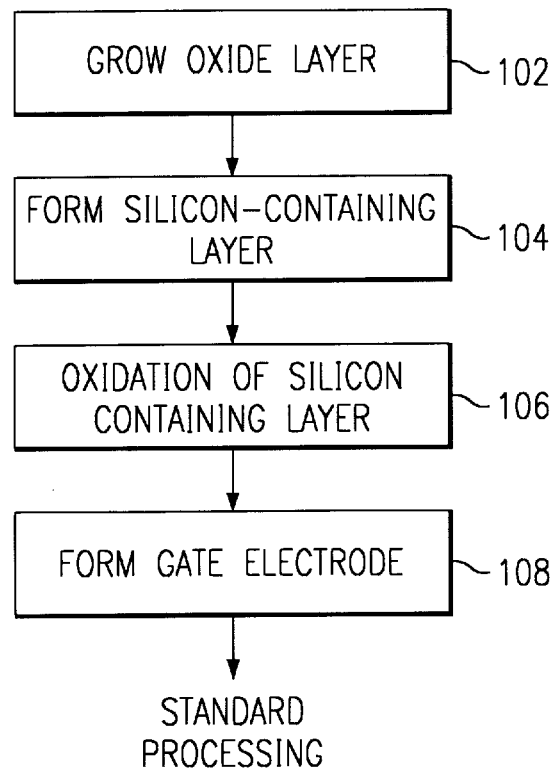
FIG. 1 is a flow diagram illustrating the method of one embodiment of the instant invention.

Common reference numerals are used throughout the figures to designate like or equivalent features.

DETAILED DESCRIPTION OF THE DRAWINGS

While the following description of the method of the instant invention revolves around the formation of a gate dielectric layer, the method of the instant invention can be used to form other dielectric layers. For example, the method of the instant invention could be utilized to form a capacitor dielectric or a liner/barrier layer for another structure.

Figure 2A:
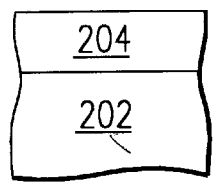
FIGS. 2a–2d are cross-sectional views of a partially fabricated semiconductor device which is fabricated using the method the embodiment of the instant invention as illustrated in FIG. 1.

Referring to step 102 of FIG. 1 and FIG. 2a, gate insulator 204 is formed on substrate 202. Preferably, gate insulator layer 204 is on the order of 1 to 2 nm (more preferably around 1.5 nm) thick. However, gate insulator layer 204 may be much thicker than 2 nm. Since the trend of present semiconductor device fabrication is to have thinner gate insulators, it is desirable to have gate insulator layer 204 as thin as possible. Using present techniques, if layer 204 is a thermally grown oxide, the thinnest this layer can reproducibly be made is around 1 nm. However, layer 204 can be thinner if a thermal oxidation technique is discovered which reproducibly fabricates this thinner thermal oxide layer. At present, gate insulator layer 204 is preferably fabricated by growing an oxide on the silicon substrate by either: subjecting the wafer to an ambient which includes $O_2$ and $N_2$ (preferably around 15% $O_2$ and 85% $N_2$ ambient) at around 600 to 650 C.; subjecting the wafer to an ambient which includes $N_2O$ and $N_2$ (preferably around 15% $N_2O$ and 85% $N_2$ ambient) at around 650 to 700 C.; or subjecting the wafer to an ambient which includes NO and $N_2$ (preferably around 50% NO and 50% $N_2$ ambient) at around 700 to 800 C. For each of these process steps, some nitrogen may be incorporated at the interface between layer 204 and substrate 202. Alternatively, thermal oxide layer 204 may be formed whereby very little nitrogen is incorporated into layer 204.

Figure 2B:
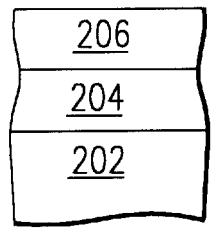

Referring to step 104 of FIG. 1 and FIG. 2b, silicon-containing layer 206 is formed on insulating layer 204. Preferably, layer 206 is comprised of either amorphous silicon or polycrystalline silicon ("poly" or "polysilicon") and is, preferably, on the order of around 1 to 2 nm (more preferably 1.5 nm) thick. However, layer 206 may be thinner or thicker than this depending on: the thickness of layer 204, the type of device being fabricated (higher-power device versus lower power device; or a capacitor), and advancement of prevailing processing techniques with regards to the formation of thermal oxides and silicon-containing layers. If layer 206 is comprised of amorphous silicon, it is, preferably, deposited on layer 204 using $SiH_4$ (or $Si_2H_6$) with a wafer temperature around 450 to 650 C. (more preferably around 550 C.).

Figure 2C:
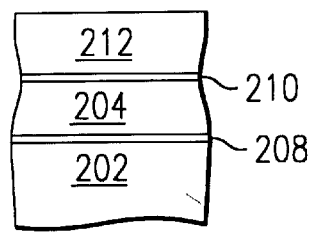

Referring to step 106 of FIG. 1 and FIG. 2c, layer 206 is, preferably, oxidized, next. This may be accomplished by subjecting the wafer to an ambient containing $N_2O$ with a wafer temperature around 700 to 750 C., or by subjecting the wafer to an ambient containing NO with a wafer temperature around 700 to 800 C. Preferably, step 106 will result in the complete oxidation of layer 206 so as to form silicon dioxide layer 212. In addition, since a nitrogen-containing atmosphere is utilized to perform this step, nitrogen may be incorporated at the interface between layer 204 and substrate 202 (shown as structure 208) and at the interface between layer 204 and oxidized layer 212 (shown as structure 210).

Figure 2D:
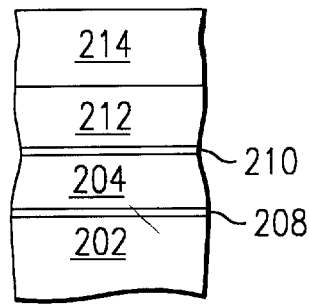

Referring to step 108 of FIG. 1 and FIG. 2d, conductive layer 214 is formed on insulating layer 212. Preferably, conductive layer will form the conductive gate structure, but if region 202 is the bottom electrode of a capacitor (as opposed to the substrate of a transistor) conductive layer 214 would become the top electrode of the capacitor. For the formation of a transistor, conductive layer 214 is preferably on the order of 150 to 450 nm thick and is comprised of: doped polysilicon, tungsten, titanium, titanium nitride, a combination of the above, or any other conductive material which may be used as a gate electrode.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating an electronic device over a semiconductor substrate which includes a dielectric layer formed between a first structure and a second structure, said method comprising the steps of:

growing an oxide-containing layer on said first structure;

forming a silicon-containing layer on said oxide-containing layer, wherein said silicon-containing layer is substantially pure silicon;

oxidizing substantially all of said silicon-containing layer by subjecting it to an ambient comprised of oxygen and nitrogen with a substrate temperature around 700 to 800 C.; and forming said second structure on said oxidized silicon-containing layer.

2. The method of claim 1, wherein said electronic device is a transistor.

3. The method of claim 2, wherein said first structure is a silicon substrate and said second structure is a gate electrode.

4. The method of claim 3, wherein said gate electrode is comprised of a material selected from the group consisting of: doped polycrystalline silicon, tungsten, titanium nitride, ruthenium, rhodium, iridium, and any combination thereof.

5. The method of claim 1, wherein said electronic device is a capacitor.

6. The method of claim 5, wherein said first structure is a bottom electrode of said capacitor and said second structure is the top electrode of said capacitor.

7. The method of claim 1, wherein said step of oxidizing substantially all of said silicon-containing layer is performed by subjecting said silicon-containing layer to an ambient containing $N_2O$ with a wafer temperature around 700 to 800 C.

8. The method of claim 1, wherein said step of oxidizing substantially all of said silicon-containing layer is performed by subjecting said silicon-containing layer to an ambient containing NO with a wafer temperature around 700 to 800 C.

9. The method of claim 1, wherein nitrogen is incorporated between said oxide-containing layer and said first structure.

10. The method of claim 1, wherein nitrogen is incorporated between said oxide-containing layer and said oxidized silicon-containing layer.

11. A method of forming a gate dielectric layer formed between a semiconductor substrate and a conductive gate electrode, said method comprised of the steps of:

growing an oxide-containing layer on said semiconductor substrate;

forming a silicon-containing layer on said oxide-containing layer, wherein said silicon-containing layer is substantially pure silicon;

oxidizing substantially all of said silicon-containing layer by subjecting it to an ambient comprised of oxygen and nitrogen with a substrate temperature around 700 to 800 C.; and forming said conductive gate electrode on said oxidized silicon-containing layer.

12. The method of claim 11, wherein said step of oxidizing substantially all of said silicon-containing layer is performed by subjecting said silicon-containing layer to an ambient containing $N_2O$ with a wafer temperature around 700 to 800 C.

13. The method of claim 11, wherein said step of oxidizing substantially all of said silicon-containing layer is performed by subjecting said silicon-containing layer to an ambient containing NO with a wafer temperature around 700 to 800 C.

14. The method of claim 11, wherein nitrogen is incorporated between said oxide-containing layer and said first structure.

15. The method of claim 11, wherein nitrogen is incorporated between said oxide-containing layer and said oxidized silicon-containing layer.

* * * * *